United States Patent
Kakinuma et al.

(10) Patent No.: US 11,935,778 B2
(45) Date of Patent: Mar. 19, 2024

(54) HOLDING MECHANISM INCLUDING BERNOULLI PAD

(71) Applicant: DISCO CORPORATION, Tokyo (JP)

(72) Inventors: Yoshinori Kakinuma, Tokyo (JP);
Yoshikuni Migiyama, Tokyo (JP);
Yoshinobu Saito, Tokyo (JP);
Jonghyun Ryu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 591 days.

(21) Appl. No.: 17/240,290

(22) Filed: Apr. 26, 2021

(65) Prior Publication Data
US 2021/0358796 A1 Nov. 18, 2021

(30) Foreign Application Priority Data

May 13, 2020 (JP) .................................. 2020-084542

(51) Int. Cl.
*H01L 21/683* (2006.01)
*B25J 15/06* (2006.01)
*H01L 21/67* (2006.01)

(52) U.S. Cl.
CPC ...... *H01L 21/6838* (2013.01); *B25J 15/0641* (2013.01); *H01L 21/67259* (2013.01)

(58) Field of Classification Search
CPC .......... H01L 21/6838; H01L 21/67259; H01L 21/677; H01L 21/68707; B25J 15/0641
USPC ..................................................... 294/64.3
See application file for complete search history.

(56) References Cited

U.S. PATENT DOCUMENTS

| | | | | |
|---|---|---|---|---|
| 6,322,116 | B1* | 11/2001 | Stevens | H01L 21/6838 294/64.3 |
| 7,100,954 | B2* | 9/2006 | Klein | H01L 21/6838 294/64.3 |
| 7,690,869 | B2* | 4/2010 | Yo | B65G 49/061 294/183 |
| 8,905,680 | B2* | 12/2014 | Lee | H01L 21/6838 406/87 |
| 9,187,256 | B2* | 11/2015 | Iwasaka | H01L 21/6838 |
| 10,464,216 | B2* | 11/2019 | Tanaka | B25J 15/0625 |
| 10,553,472 | B2* | 2/2020 | Bosboom | H01L 21/68707 |
| 10,840,122 | B2* | 11/2020 | Kobayashi | H01L 21/67265 |
| 10,864,643 | B2* | 12/2020 | Yoshida | H01L 21/67706 |
| 11,715,663 | B2* | 8/2023 | Sugakawa | B65H 5/226 156/60 |

(Continued)

FOREIGN PATENT DOCUMENTS

JP 2005142462 A 6/2005

*Primary Examiner* — Paul T Chin
(74) *Attorney, Agent, or Firm* — Greer Burns & Crain Ltd.

(57) ABSTRACT

A holding mechanism includes a Bernoulli pad that holds a plate-shaped body, a hand on which the Bernoulli pad is disposed, a sensor that is disposed on the hand and detects that the plate-shaped body is held under suction by the Bernoulli pad, a lateral movement restriction section disposed on the hand, a tube that connects an air source supplying air to the Bernoulli pad and the Bernoulli pad, an adjustment valve that is disposed in the tube and adjusts a flow rate of air supplied to the Bernoulli pad, and a control section that controls operation of the adjustment valve. The control section gradually increases the flow rate of the air supplied from the adjustment valve to the Bernoulli pad and, when it is detected by the sensor that the plate-shaped body has been held under suction by the Bernoulli pad, fixes the flow rate of the air.

3 Claims, 4 Drawing Sheets

(56) References Cited

U.S. PATENT DOCUMENTS

| | | | | |
|---|---|---|---|---|
| 2008/0129064 A1* | 6/2008 | Harvey | ............... | H01L 21/6838 |
| | | | | 294/64.3 |
| 2021/0050244 A1* | 2/2021 | Kakinuma | .......... | H01L 21/6838 |
| 2021/0229935 A1* | 7/2021 | Tokunaga | .............. | B65G 47/91 |

* cited by examiner

HOLDING MECHANISM INCLUDING BERNOULLI PAD

BACKGROUND OF THE INVENTION

Field of the Invention

The present invention relates to a holding mechanism including a Bernoulli pad that holds a plate-shaped body by an action of a negative pressure generated by blowing air to the plate-shaped body.

Description of Related Art

On electric equipment such as mobile phones and personal computers, device chips are mounted. The device chips are obtained by grinding a back side as a whole of a wafer formed on a front side thereof with a plurality of devices such as integrated circuits (ICs) and large scale integrations (LSIs) by a grinding apparatus to thin the wafer, and dividing the thinned wafer by a cutting apparatus or a laser processing apparatus. A plurality of streets are set in a grid pattern on the front surface of the wafer before dividing, and the above-described devices are formed in a plurality of regions partitioned by the streets. On the front side of the wafer, an annular peripheral marginal area where the devices are not formed is present in a periphery of a device area where the plurality of devices are formed.

Incidentally, at the time of manufacturing the device chips, there is a technique of grinding a central portion on the back side corresponding to the device area, without grinding a peripheral portion on the back side corresponding to the peripheral marginal area, to thin the back side and form a recess. In this case, the peripheral portion functions as a thick reinforcement section, so that effects of reducing warpage of the wafer, enhancing strength of the wafer, and the like are obtained. However, in a case where a thickness of the wafer at the portion corresponding to the device area is reduced to a thickness on the order of, for example, 30 μm, there arises a fear of damaging the wafer when conveying the wafer by putting a suction pad to the device area. In view of this, there has been developed a holding mechanism including a Bernoulli pad that holds the wafer without making contact with the device area (see, for example, Japanese Patent Laid-open No. 2005-142462).

SUMMARY OF THE INVENTION

A Bernoulli pad holds a wafer under suction by utilizing a negative pressure generated by blowing air to the wafer. As the pressure of air supplied is raised, a greater negative pressure can be generated; however, as the pressure of air is raised, a collision force of air blown to the wafer exerted on the wafer is also raised, so that the wafer is vibrated, leading to damage to the wafer. Note that the problem of vibration of the wafer leading to damage to the wafer may occur even with an ordinary wafer which is not formed with a recess on the back side. The present invention has been made in consideration of such a problem. Accordingly, it is an object of the present invention to hold a plate-shaped body such as a wafer under suction by use of a Bernoulli pad in such a manner as not to damage the plate-shaped body.

In accordance with an aspect of the present invention, there is provided a holding mechanism including a Bernoulli pad that holds a plate-shaped body by an action of a negative pressure generated by blowing air to the plate-shaped body. The holding mechanism includes a hand on which the Bernoulli pad is disposed, a sensor that is disposed on the hand and detects that the plate-shaped body is held under suction by the Bernoulli pad, a lateral movement restriction section that is disposed on the hand and restricts lateral movement of the plate-shaped body, a tube that connects an air source supplying air to the Bernoulli pad and the Bernoulli pad, an adjustment valve that is disposed in the tube and adjusts a flow rate of air supplied to the Bernoulli pad, and a control section that controls operation of the adjustment valve. The control section gradually increases the flow rate of the air supplied from the adjustment valve to the Bernoulli pad and, when it is detected by the sensor that the plate-shaped body has been held under suction by the Bernoulli pad by receiving the action of the negative pressure, fixes the flow rate of the air.

Preferably, the sensor is a proximity sensor, and when it is detected by the sensor that a distance between the sensor and the plate-shaped body has become a predetermined length, the control section decides that the plate-shaped body has been held under suction by the Bernoulli pad and fixes the flow rate of the air supplied from the adjustment valve to the Bernoulli pad.

In addition, preferably, the sensor is a vibration sensor, and when it is detected by the sensor that an amplitude of vibration of the plate-shaped body that gradually increases with an increase in the flow rate of the air has become a predetermined amount, the control section decides that the plate-shaped body has been held under suction by the Bernoulli pad and fixes the flow rate of the air supplied from the adjustment valve to the Bernoulli pad.

In the holding mechanism according to an aspect of the present invention, the control section gradually increases the flow rate of the air supplied from the adjustment valve to the Bernoulli pad and, when it is detected by the sensor that the plate-shaped body has been held under suction by the Bernoulli pad by receiving the action of the negative pressure, fixes the flow rate of the air. In other words, it is possible to prevent the collision force of air from becoming excessively high, so that the plate-shaped body can be properly held under suction with a suction force of such an extent as not to damage the plate-shaped body.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 1 is a perspective view of a holding mechanism and the like;

DETAILED DESCRIPTION OF THE PREFERRED EMBODIMENTS

Figure 1:
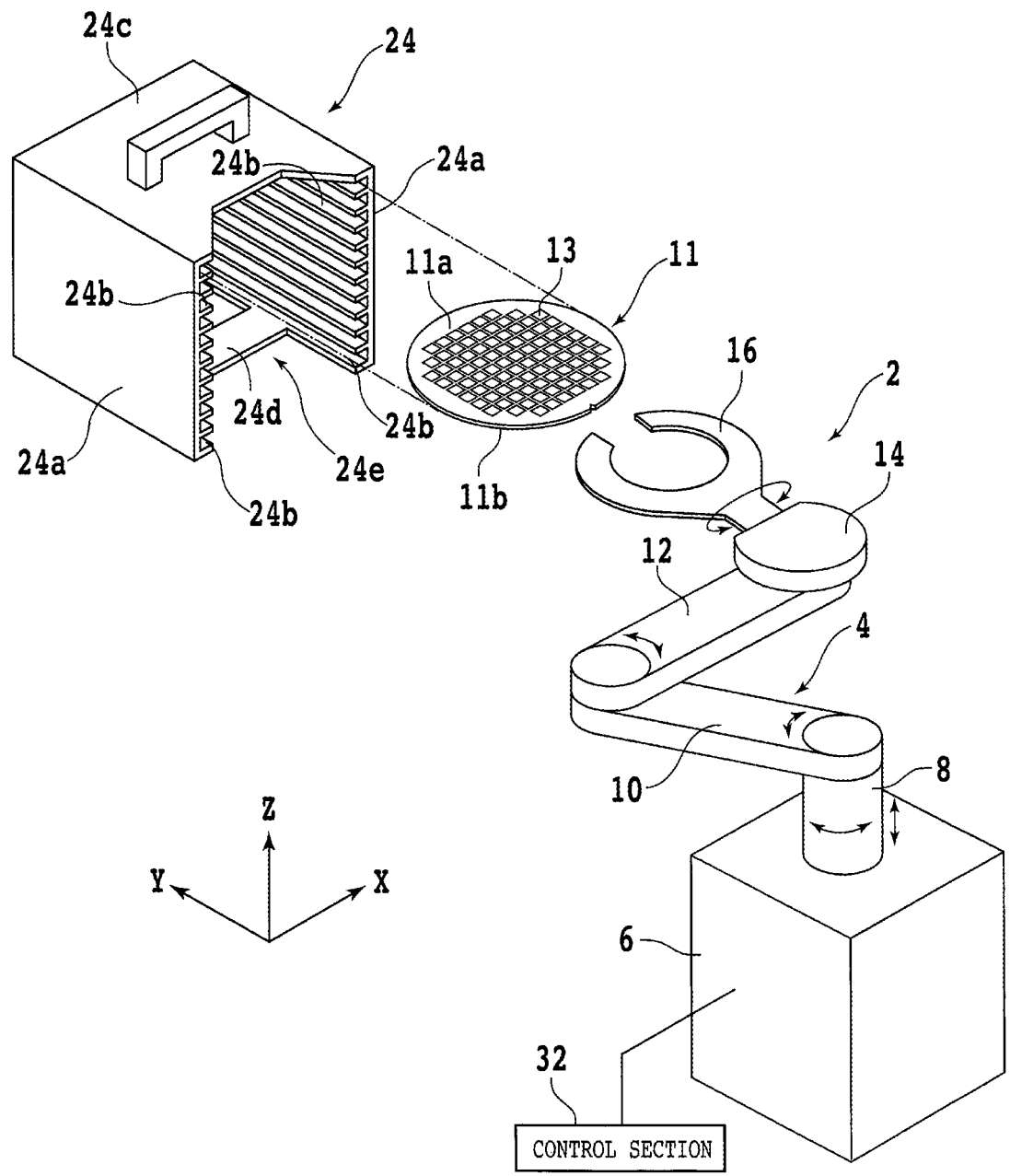

An embodiment according to a mode of the present invention will be described referring to the attached drawings. First, description will be made of a holding mechanism 2 that is mounted on a processing apparatus (not illustrated) such as a cutting apparatus, a grinding apparatus, a laser processing apparatus, and a tape attaching apparatus and that conveys a wafer (plate-shaped body) 11 as an object of processing or the like. FIG. 1 is a perspective view of the holding mechanism 2 and the like. The holding mechanism 2 has a first driving section 6. The first driving section 6 has a motor not illustrated or the like such that a cylindrical support member 8 connected to an upper portion of the first driving section 6 can be moved vertically along a Z-axis direction and can be rotated around a rotational axis substantially parallel to the Z-axis direction.

To an upper portion of the support member 8, one end portion of a first link 10 is connected so as to be rotatable around a rotational axis substantially parallel to the Z-axis direction. To an upper portion of another end portion of the first link 10, a bottom portion of one end portion of a second link 12 is connected so as to be rotatable around a rotational axis substantially parallel to the Z-axis direction. To an upper portion of another end portion of the second link 12, a bottom portion of a second driving section 14 is connected so as to be rotatable around a rotational axis substantially parallel to the Z-axis direction. To a side portion of the second driving section 14, a hand 16 is connected so as to be rotatable around a predetermined straight line substantially parallel to an XY plane.

Figure 2:
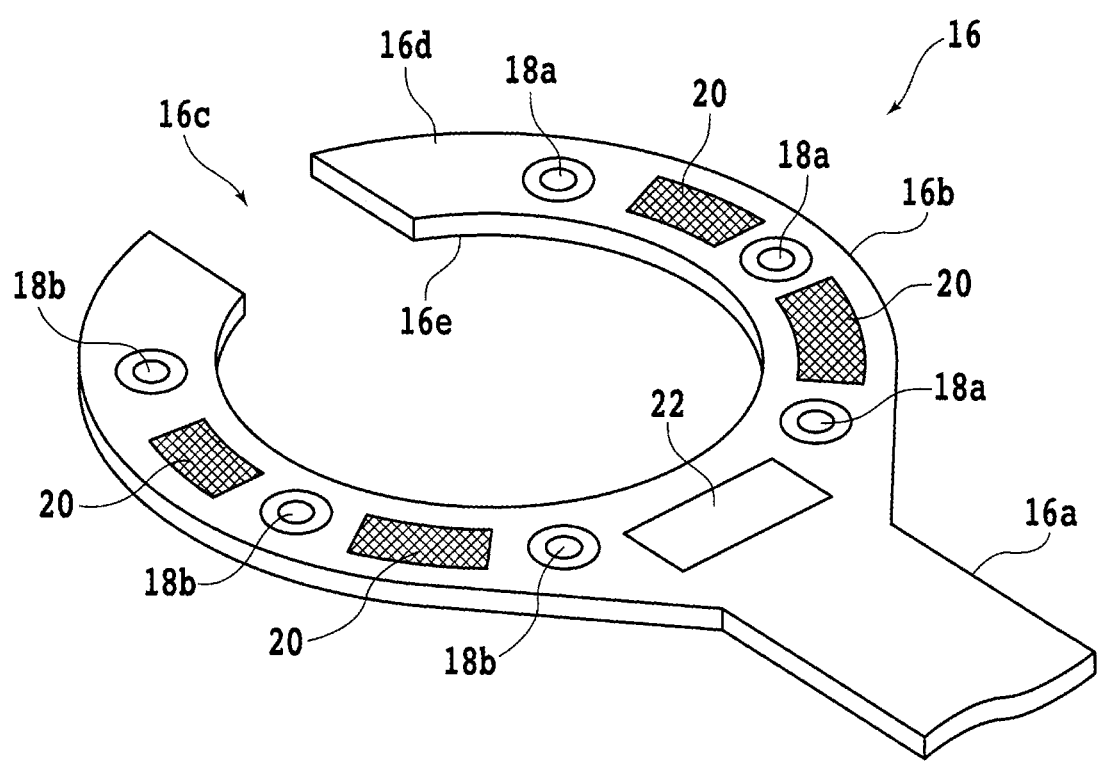
FIG. 2 is an enlarged perspective view of one surface side of a hand.

Here, a structure of the hand 16 according to a first embodiment will be described referring to FIG. 2. FIG. 2 is an enlarged perspective view of one surface 16*d* side of the hand 16. The hand 16 has a rectangular plate-shaped base section 16*a* of which one end portion is connected to the second driving section 14. To another end portion of the base section 16*a*, an arcuate tip section 16*b* formed of a metal such as the same stainless steel as the base section 16*a* or the like is connected. The arc formed by the tip section 16*b* has a center angle of equal to or more than 270 degrees. The tip section 16*b* of this example has a cutout 16*c* having substantially the same width as the width of the base section 16*a*, on the opposite side of the center of the arc from the other end portion of the base section 16*a*.

On the one surface 16*d* side of the tip section 16*b*, a plurality of Bernoulli pads 18*a* and 18*b* are provided. Specifically, with a virtual straight line connecting the cutout 16*c* and the base section 16*a* as a center, three Bernoulli pads 18*a* are disposed on one side, and three Bernoulli pads 18*b* are disposed on the other side, in line symmetry. Each of the Bernoulli pads 18*a* and 18*b* jets air such that a swirling flow is generated in a direction from another surface 16*e* to the one surface 16*d* of the tip section 16*b*. The Bernoulli pads 18*a* and 18*b* are basically the same, but, for example, for the purpose of preventing rotation of an object to be sucked, the direction of rotation of the swirling flow is set conversely.

In a vicinity of a rotational axis of the swirling flow, pressure is lowered according to Bernoulli's principle, so that a negative pressure is generated. The wafer 11 located in a vicinity of the hand 16 is held under suction in a non-contact manner by the Bernoulli pads 18*a* and 18*b* by a balance between an upward force caused by an action of the negative pressure and a downward force caused by a collision force of air and the weight of the wafer 11 itself. Between the three Bernoulli pads 18*a*, for example, a rubber pad (lateral movement restriction section) 20 formed of a rubber sheet is disposed. Note that a rubber pad 20 is also disposed similarly between the three Bernoulli pads 18*b*.

The rubber pads 20 each project further than a projection amount of the Bernoulli pads 18*a* from the one surface 16*d*. The projection amount of the rubber pads 20 is adjusted so as to be able to contact the wafer 11 when the wafer 11 is sucked by the Bernoulli pads 18*a* and 18*b*. Therefore, when the wafer 11 is held under suction by the Bernoulli pads 18*a* and 18*b*, movement (lateral movement) of the wafer 11 in a lateral direction parallel to the XY plane is restricted. Note that, in place of the rubber pads 20, guides, pins, or the like (lateral movement restriction section) for restricting lateral movement of the wafer 11 may be provided on the hand 16.

Between the Bernoulli pads 18*a* and 18*b* that are each disposed at a position closest to the base section 16*a*, a sensor 22 that detects that the wafer 11 has been held under suction by the Bernoulli pads 18*a* and 18*b* is disposed. The sensor 22 in the present embodiment is a capacitance-type proximity sensor capable of measuring a distance from a probe of the sensor 22 to the wafer 11. The capacitance of the sensor 22 varies according to the distance A (see FIG. 3) between the probe of the sensor 22 and the wafer 11. The capacitance detected by the sensor 22 is outputted to a control section 32 described later and is converted into the distance A by the control section 32.

Here, referring to FIG. 1, the wafer 11 and the like will be described. The wafer 11 is, for example, formed of a semiconductor material such as silicon. On a front surface 11*a* of the wafer 11, a plurality of streets are set in a grid pattern. In each of a plurality of regions partitioned by the plurality of streets, a device 13 such as an integrated circuit (IC) is formed. Note that a material, a shape, a structure, a size, and the like of the wafer 11 are not limited. For example, the wafer 11 may be formed of a material other than silicon, such as a semiconductor, a ceramic, a resin, a metal, and the like. Similarly, a kind, a number, a shape, a structure, a size, layout, and the like of the devices 13 are also not limited.

A plurality of wafers 11 are accommodated in a cassette 24. The cassette 24 has a pair of side surfaces 24*a*. An inner surface of each side surface 24*a* is formed with a plurality of support grooves 24*b* at a predetermined interval along a height direction of the cassette 24. With respect to each pair of opposed support grooves 24*b*, one wafer 11 is accommodated. Upper portions of the pair of side surfaces 24*a* are connected by a top plate 24*c*, and lower portions of the pair of side surfaces 24*a* are connected by an elongate plate-shaped connection section 24*d*. In addition, an opening 24*e* is formed at one end portion (front portion) in a lateral direction of the pair of side surfaces 24*a*.

Figure 3:
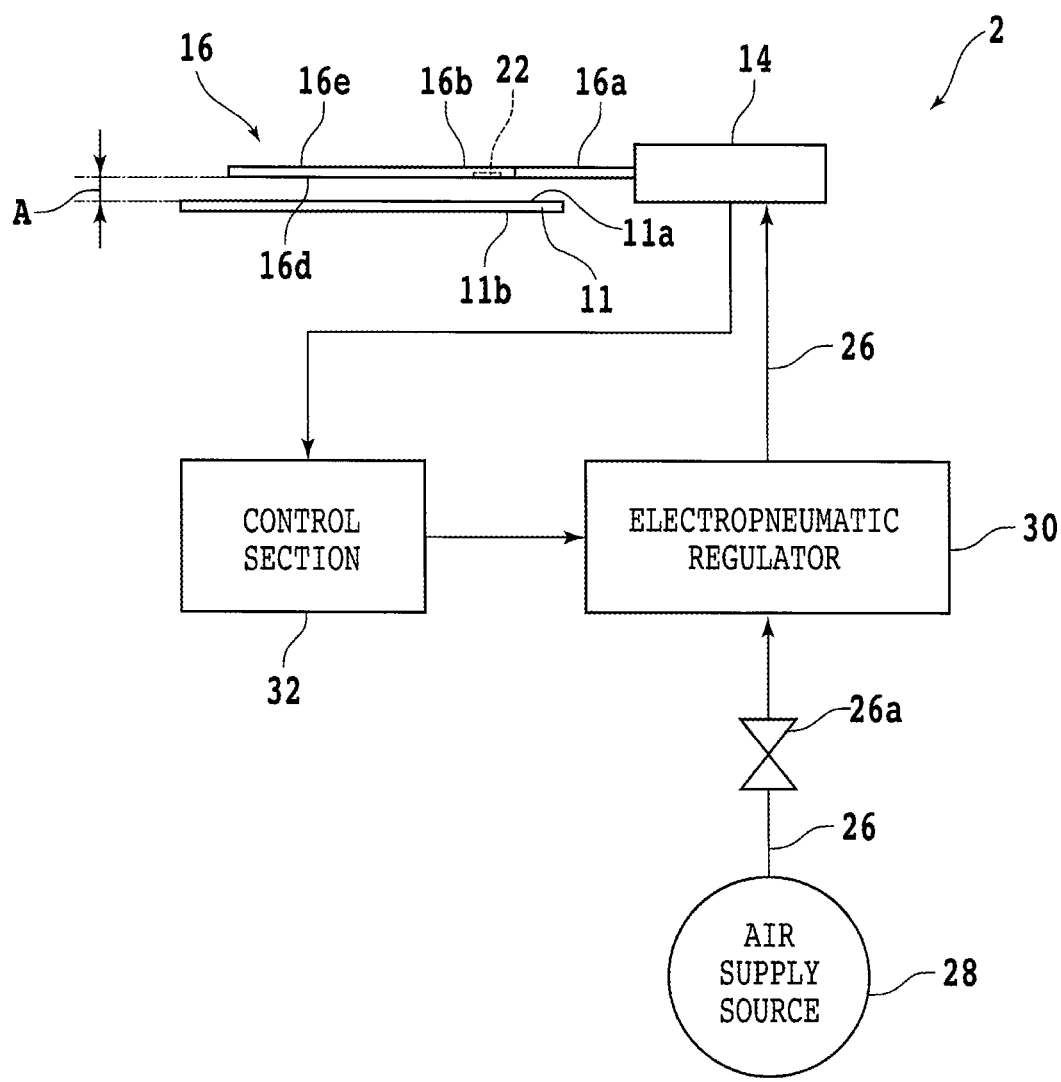
FIG. 3 is a diagram depicting a manner in which a flow rate of air is adjusted to hold a wafer under suction.

The hand 16 is made to enter the cassette 24 through the opening 24*e*, and the one surface 16*d* of the hand 16 is disposed on an upper side of the wafer 11, after which air is blown from the Bernoulli pads 18*a* and 18*b* to the wafer 11, so that the wafer 11 is sucked to the one surface 16*d* (see FIG. 3). As depicted in FIG. 3, an air supply source (air source) 28 is connected to the Bernoulli pads 18*a* and 18*b* through an air tube 26. The air supply source 28 has a compressor that compresses air and feeds out the compressed air, a tank that reserves the compressed air, and the like.

An electropneumatic regulator (adjustment valve) 30 is disposed in the air tube 26. The electropneumatic regulator 30 is a proportional control valve capable of continuously controlling the pressure of air outputted according to an input signal and has a controller (not illustrated) for controlling operations of an exhaust valve and an air supply valve (both not illustrated). The controller controls opening and closing of the exhaust valve and the air supply valve, to thereby control the pressure of air at an output port of the electropneumatic regulator 30. Note that air is supplied to the air supply valve from the air supply source 28 through the air tube 26, and air adjusted to a predetermined pressure is supplied from the output port to the air tube 26 on a downstream side.

The electropneumatic regulator 30 is provided with a pressure sensor (not illustrated) that monitors the pressure of air at the output port. When an input signal designating a pressure value of air outputted from the output port is inputted into the controller, the controller controls the exhaust valve and the air supply valve according to the input signal and is fed back with the pressure value acquired by the pressure sensor. Based on the feedback of the pressure value, the controller controls the exhaust valve and the air supply valve such that the pressure value of air at the output port becomes the designated pressure value. Accordingly, the pressure of air at the output port is corrected.

The pressure of air at the output port is adjusted by the input signal inputted to the controller, so that a flow rate (namely, a flow rate per unit time) of air supplied to the Bernoulli pads 18a and 18b is adjusted. For example, by continuously varying the pressure of air at the output port, the flow rate of air from the output port can be continuously varied. Specifically, as the pressure of air at the output port is set higher, the flow rate of air jetted from the output port can be increased, and, as the pressure of air at the output port is set lower, the flow rate of air jetted from the output port can be decreased.

A stopcock 26a such as a manual valve is disposed between the air supply source 28 and the electropneumatic regulator 30. When the stopcock 26a is set into an open state, air is supplied at a pressure of, for example, approximately 0.3 MPa from the air supply source 28 to an air supply port of the electropneumatic regulator 30. The operation of the electropneumatic regulator 30 is controlled by the control section 32. The control section 32 is a main body of control of the above-described processing apparatus and also controls components of the holding mechanism 2 such as a link mechanism 4, the Bernoulli pads 18a and 18b, and the sensor 22.

The control section 32 includes a computer including, for example, a processing device such as a processor represented by a central processing unit (CPU), a main storage device such as a dynamic random access memory (DRAM), a static random access memory (SRAM), and a read only memory (ROM), and an auxiliary storage device such as a flash memory, a hard disk drive, and a solid state drive. A software including a predetermined program is stored in the auxiliary storage device. By operating the processing device and the like according to this software, functions of the control section 32 are realized. Next, a method of holding the wafer 11 under suction by the Bernoulli pads 18a and 18b by adjusting the flow rate of air by the control section 32 will be described.

Figure 4:
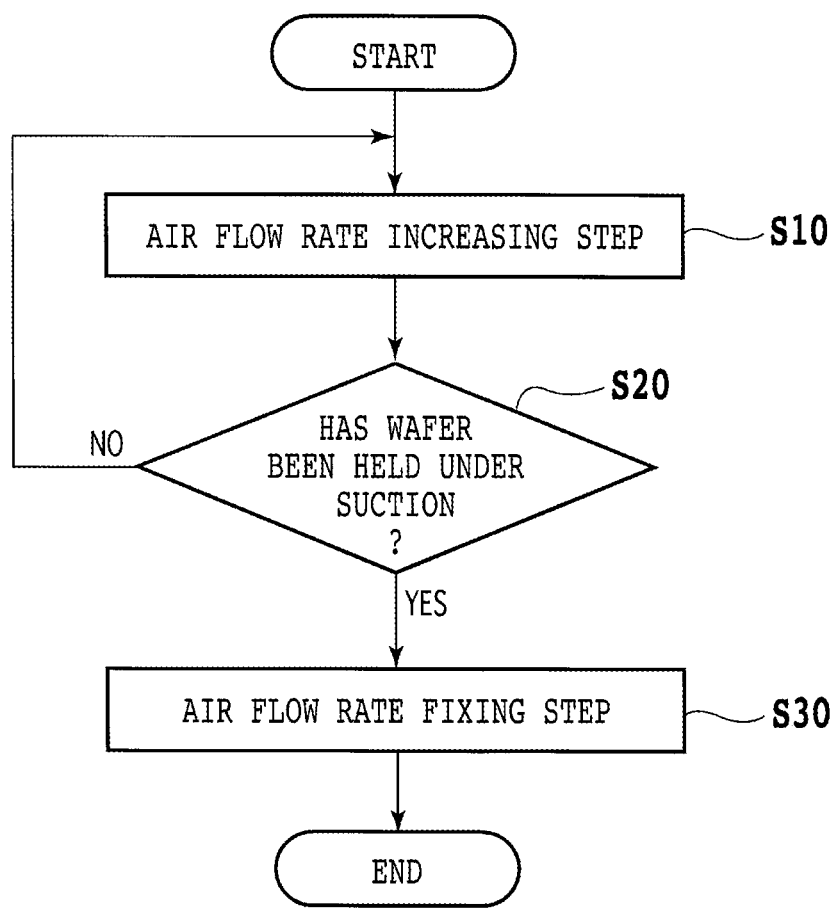
FIG. 4 is a flow chart when the flow rate of air is adjusted to hold the wafer under suction.

FIG. 3 is a diagram depicting the manner in which the flow rate of air is adjusted to hold the wafer 11 under suction, and FIG. 4 is a flow chart when the flow rate of air is adjusted to hold the wafer 11 under suction. Note that, in FIG. 3, the Bernoulli pads 18a and 18b and the rubber pads 20 are omitted. At the time of holding the wafer 11 under suction, first, the link mechanism 4 is operated to dispose the hand 16 on the upper side of one wafer 11 accommodated in the cassette 24. In the present embodiment, the one surface 16d of the hand 16 is made to face the front surface 11a of the wafer 11, but, in a case where a back surface 11b of the wafer 11 is directed upward, the one surface 16d may be made to face the back surface 11b.

Next, an input signal to the electropneumatic regulator 30 is controlled, to gradually increase the flow rate of air supplied from the electropneumatic regulator 30 to the Bernoulli pads 18a and 18b from zero (air flow rate increasing step S10). The control section 32 monitors the capacitance of the sensor 22, thereby monitoring the distance A between the probe of the sensor 22 and the wafer 11 on a real-time basis. When the distance A has not reached a predetermined length, the control section 32 decides that the wafer 11 has not been held under suction (NO at S20) and continues to increase the flow rate of air.

On the other hand, when it is detected by the sensor 22 that the distance A has reached the predetermined length, the control section 32 decides that the wafer 11 has been held under suction (YES at S20). Note that the predetermined length of the distance A varies according to a diameter, a thickness, a material, and the like of the wafer 11. For example, in the case of a silicon wafer 11 having a diameter of 300 mm, a thickness of a peripheral portion corresponding to a peripheral marginal area of 100 μm, and a thickness of a portion corresponding to a device area of 30 μm, the predetermined length of the distance A is 0.5 mm.

When the distance A has reached the predetermined length, the control section 32 decides that the wafer 11 has been held under suction by the Bernoulli pads 18a and 18b and fixes the flow rate of air supplied from the electropneumatic regulator 30 (air flow rate fixing step S30). The control section 32 in the present embodiment, when the distance A has reached the predetermined length, decides that the wafer 11 has been held under suction by the Bernoulli pads 18a and 18b and fixes the flow rate of air. Therefore, the collision force of air against the wafer 11 can be prevented from becoming excessively high, so that the wafer 11 can be properly held under suction by such a suction force as not to damage the wafer 11.

Incidentally, when the distance A has reached the predetermined length, the wafer 11 is in the state of being held under suction with a minimum suction force, and the wafer 11 may drop from the hand 16 for some reason. However, if the flow rate of air is raised excessively, there is still a fear of damaging of the wafer 11. Specifically, since the collision force of air increases when the flow rate of air is increased, the wafer 11 in the sucked state is vibrated in the manner of waving in a thickness direction of the wafer 11. An amplitude of this vibration increases as the collision force of air increases, possibly leading to damaging of the wafer 11.

In view of this, in a second embodiment, a capacitance-type vibration sensor is used as the sensor 22. In addition, the control section 32 monitors the amplitude of vibration of the wafer 11 which gradually increases with an increase in the flow rate of air. In the second embodiment, also, the wafer 11 is held under suction by a procedure similar to that of FIG. 4. First, the link mechanism 4 is operated to cause the one surface 16d of the hand 16 to face one wafer 11 accommodated in the cassette 24.

Next, the input signal to the electropneumatic regulator 30 is controlled, and the flow rate of air supplied from the electropneumatic regulator 30 to the Bernoulli pads 18a and 18b is gradually increased from zero (air flow rate increasing step S10). The control section 32 monitors the distance A by using the sensor 22 on a real-time basis, thereby monitoring the amplitude of the vibration of the wafer 11. When the amplitude has not reached a predetermined amount, the control section 32 decides that the wafer 11 has not been held under suction (NO at S20) and continues to increase the flow rate of air.

As the flow rate of air is increased, the wafer 11 is raised and is held under suction by the Bernoulli pads 18a and 18b. In this instance, the flow rate of air is the same as the flow rate fixed in the air flow rate fixing step S30 in the first embodiment. However, vibration is not substantially generated at this stage, and, even if vibration is generated, it is not vibration of such an extent to damage the wafer 11.

The flow rate of air is continued to be increased, and when it is detected by the sensor 22 that the amplitude has reached the predetermined amount, the control section 32 decides that the wafer 11 has been held under suction (YES at S20). The predetermined amount of amplitude varies according to the diameter, the thickness, the material, and the like of the wafer 11. For example, in the case of a silicon wafer 11 having a diameter of 300 mm, a thickness of a peripheral portion corresponding to a peripheral marginal area of 100 μm, and a thickness of a portion corresponding to a device area of 30 μm, the predetermined amount of amplitude is 1.0 μm.

When the amplitude of the wafer 11 has reached the predetermined amount, the control section 32 decides that the wafer 11 has been properly held under suction by the Bernoulli pads 18a and 18b and fixes the flow rate of air (air flow rate fixing step S30). In the present embodiment, even while holding the wafer 11 under suction by a larger suction force than that in the first embodiment, it is possible to prevent the wafer 11 from being damaged due to excessive vibration. Other than the above-mentioned points, structures, methods, and the like according to the above-described embodiments can be implemented with appropriate modifications insofar as the modifications do not depart from the scope of the object of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A holding mechanism including a Bernoulli pad that holds a plate-shaped body by an action of a negative pressure generated by blowing air to the plate-shaped body, the holding mechanism comprising:
    a hand on which the Bernoulli pad is disposed;
    a sensor that is disposed on the hand and detects that the plate-shaped body is held under suction by the Bernoulli pad;
    a lateral movement restriction section that is disposed on the hand and restricts lateral movement of the plate-shaped body;
    a tube that connects an air source supplying air to the Bernoulli pad and the Bernoulli pad;
    an adjustment valve that is disposed in the tube and adjusts a flow rate of air supplied to the Bernoulli pad; and
    a control section that controls operation of the adjustment valve,
    wherein the control section gradually increases the flow rate of the air supplied from the adjustment valve to the Bernoulli pad and, when it is detected by the sensor that the plate-shaped body has been held under suction by the Bernoulli pad by receiving the action of the negative pressure, fixes the flow rate of the air.

2. The holding mechanism according to claim 1,
    wherein the sensor is a proximity sensor, and
    when it is detected by the sensor that a distance between the sensor and the plate-shaped body has become a predetermined length, the control section decides that the plate-shaped body has been held under suction by the Bernoulli pad and fixes the flow rate of the air supplied from the adjustment valve to the Bernoulli pad.

3. The holding mechanism according to claim 1,
    wherein the sensor is a vibration sensor, and
    when it is detected by the sensor that an amplitude of vibration of the plate-shaped body that gradually increases with an increase in the flow rate of the air has become a predetermined amount, the control section decides that the plate-shaped body has been held under suction by the Bernoulli pad and fixes the flow rate of the air supplied from the adjustment valve to the Bernoulli pad.

* * * * *